(12) United States Patent
Ran et al.

(10) Patent No.: US 12,081,148 B2
(45) Date of Patent: Sep. 3, 2024

(54) GEAR CONTROL CIRCUIT AND SYSTEM FOR ALTERNATING CURRENT MOTOR, SWITCH CONTROLLER, AND ELECTRONIC DEVICE

(71) Applicant: BEIANG AIR TECH LTD., Suzhou (CN)

(72) Inventors: Hongyu Ran, Suzhou (CN); Yan Zhang, Suzhou (CN); Yigang Liu, Suzhou (CN); Mingming Wei, Suzhou (CN); Hongqiang Li, Suzhou (CN)

(73) Assignee: BEIANG AIR TECH LTD., Jiangsu (CN)

( * ) Notice: Subject to any disclaimer, the term of this patent is extended or adjusted under 35 U.S.C. 154(b) by 160 days.

(21) Appl. No.: 17/794,610

(22) PCT Filed: Nov. 12, 2021

(86) PCT No.: PCT/CN2021/130361
§ 371 (c)(1),
(2) Date: Jul. 21, 2022

(87) PCT Pub. No.: WO2022/193696
PCT Pub. Date: Sep. 22, 2022

(65) Prior Publication Data
US 2023/0327590 A1  Oct. 12, 2023

(30) Foreign Application Priority Data

Mar. 19, 2021 (CN) .......................... 202110299651.5
Mar. 19, 2021 (CN) .......................... 202110299653.4

(51) Int. Cl.
*H02P 21/18* (2016.01)
*F16H 61/02* (2006.01)
*H02P 27/08* (2006.01)

(52) U.S. Cl.
CPC ......... *H02P 21/18* (2016.02); *F16H 61/0213* (2013.01); *H02P 27/08* (2013.01)

(58) Field of Classification Search
CPC .......... H02P 21/18; H02P 27/08; H02P 25/04; H02P 7/29; H02P 25/22; H02P 25/16;
(Continued)

(56) References Cited

U.S. PATENT DOCUMENTS

| 7,042,180 B2 * | 5/2006 | Terry ........................ H02P 6/34 318/473 |
| 8,643,319 B2 * | 2/2014 | Celik ........................ H02P 6/14 318/400.41 |

(Continued)

FOREIGN PATENT DOCUMENTS

| CN | 205265646 U | 5/2016 |
| CN | 108390613 A | 8/2018 |

(Continued)

*Primary Examiner* — David Luo
(74) *Attorney, Agent, or Firm* — SZDC Law PC

(57) ABSTRACT

The application provides a gear control circuit and system for an alternating current motor. The gear control circuit includes: a plurality of controllable switches; a detection unit, configured to detect switching statuses corresponding to the controllable switches; a gear input unit, configured to receive a target gear m inputted from outside; and a control unit, connected to the gear input unit and configured to obtain the target gear m. The application also provides a switch controller and an electronic device. The switch controller includes a signal modulation circuit, a signal follower circuit, a comparison circuit, and a switch control circuit. The switch controller may perform digital-to-analog conversion by using the signal modulation circuit, to modulate a first PWM signal being a digital signal into a second PWM signal being an analog signal, and then the signal follower circuit performs load amplification on the modulated second PWM signal.

19 Claims, 6 Drawing Sheets

(58) Field of Classification Search
CPC ....... H02P 17/00; F16H 61/0213; H03K 3/42; H03K 7/08; H02M 1/092
USPC .............................. 318/400.02, 400.01, 700
See application file for complete search history.

(56) References Cited

U.S. PATENT DOCUMENTS

| | | | |
|---|---|---|---|
| 8,878,508 B2 * | 11/2014 | Yamada | H02M 3/156 323/284 |
| 10,425,034 B2 * | 9/2019 | Bian | H02M 7/44 |
| 2007/0013332 A1 | 1/2007 | Grbovic | |
| 2012/0223690 A1 | 9/2012 | Yamada | |

FOREIGN PATENT DOCUMENTS

| | | |
|---|---|---|
| CN | 208401817 U | 1/2019 |
| CN | 109475029 A | 3/2019 |
| CN | 209795173 U | 12/2019 |
| CN | 112953478 A | 6/2021 |
| CN | 113067525 A | 7/2021 |
| JP | 2001071906 A | 3/2001 |

* cited by examiner

GEAR CONTROL CIRCUIT AND SYSTEM FOR ALTERNATING CURRENT MOTOR, SWITCH CONTROLLER, AND ELECTRONIC DEVICE

CROSS-REFERENCE TO RELATED APPLICATION

This patent application is the National Stage Application of PCT/CN2021/130361, filed on Nov. 12, 2021, which claims priority to Chinese patent application No. 202110299651.5 filed on Mar. 19, 2021 and Chinese patent application No. 202110299653.4 filed on Mar. 19, 2021, the disclosure of which is hereby incorporated by reference in their entirety.

FIELD OF THE INVENTION

The present application relates to the field of gear control technology, and more particularly to a gear control circuit and system for an alternating current motor. In some implementations, the present invention relates to the field of device control, and specifically, to a switch controller and an electronic device.

DESCRIPTION OF THE RELATED ART

A multi-gear motor is a motor with multiple operating gears. The operating gears correspond to different motor speeds. The motor speed increases as the gear increases. The motor uses a plurality of controllable switches to implement gear switching control.

However, when too many gears are skipped, an existing alternating current motor generates a large inrush current to controllable switches (such as relays or IGBTs) for controlling gears to be turned on or off, which in turn causes large losses and short service life of the controllable switches.

In addition, pulse width modulation (PWM) is a method for digitally encoding the level of an analog signal. A PWM signal is a digital signal. At present, limited by the performance of a PWM signal, it is inconvenient to use a PWM signal to control a high-power electronic device to start or stop.

SUMMARY OF THE INVENTION

An object of the embodiments of the present application is to provide a gear control circuit and system for an alternating current motor, to resolve the problem that when too many gears are skipped, an alternating current motor generates a large inrush current to controllable switches for controlling gears to be turned on or off, which in turn causes large losses and short service life of the controllable switches.

According to a first aspect, the present invention provides a gear control circuit for an alternating current motor, the gear control circuit including: a plurality of controllable switches, the controllable switches being connected to a live wire of an alternating current power supply and being connected to a plurality of gears of an alternating current motor in a one-to-one correspondence; a detection unit, connected to the controllable switches, and configured to detect switching statuses corresponding to the controllable switches; a gear input unit, configured to receive a target gear m inputted from outside; and a control unit, connected to the gear input unit and configured to obtain the target gear m, where the control unit is further connected to the controllable switches and the detection unit and configured to obtain a current gear n of the alternating current motor according to the switching statuses of the controllable switches; if m is greater than n, the control unit controls controllable switches corresponding to all gears between n and m to be sequentially turned on in an ascending order of the gears and turns off a controllable switch corresponding to a gear i−1 after a controllable switch corresponding to a gear i is turned on; and if m is less than n, the control unit controls controllable switches corresponding to all gears between m and n to be sequentially turned on in a descending order of the gears and turns off a controllable switch corresponding to a gear i+1 after a controllable switch corresponding to a gear i is turned on.

In the gear control circuit of the foregoing design, the control unit receives the target gear m inputted by the gear input unit, and the current gear n is determined by using the switching statuses of the controllable switches detected by the detection unit. Next, in a case that m is greater than n, the control unit controls controllable switches corresponding to all gears between n and m to be sequentially turned on in an ascending order of the gears and turns off a controllable switch corresponding to a gear i−1 after a controllable switch corresponding to a gear i is turned on; and in a case that m is less than n, the control unit controls controllable switches corresponding to all gears between m and n to be sequentially turned on in a descending order of the gears and turns off a controllable switch corresponding to a gear i+1 after a controllable switch corresponding to a gear i is turned on. With such a design, during gear switching, gears are gradually and sequentially switched, to make switching of gears smoother. The gradual gear switching generates a smaller inrush current compared with a one-step adjustment to a gear with too many gears skipped, thereby reducing the losses of the controllable switches and extending the service life of the controllable switches.

In an optional implementation of the first aspect, the detection unit includes a plurality of status detection circuits, and two input terminals of each status detection circuit are respectively connected to an output terminal of one controllable switch and a neutral wire of an alternating current power supply, to obtain the switching status of the correspondingly connected controllable switch; and the control unit is connected to an output terminal of each status detection circuit and configured to receive the switching statuses of the controllable switches, and in response to determining, according to the switching statuses of the controllable switches, that only one controllable switch is in a closed state, a gear corresponding to the controllable switch in a closed state is determined as the current gear n of the alternating current motor.

In an optional implementation of the first aspect, the control unit is further configured to determine, in response to determining that no controllable switch is in a closed state, that the alternating current motor is not started.

In an optional implementation of the first aspect, each status detection circuit includes a resistor R1, a resistor R2, a diode Q1, an optoisolator D1, a resistor R3, a resistor R4, a resistor R5, and a capacitor C1, one terminal of the resistor R1 is connected to an output terminal of a controllable switch of a corresponding gear, the other terminal of the resistor R1 is connected to a first terminal of the resistor R2, a second terminal of the resistor R2 is connected to a positive electrode of a transmit terminal of the optoisolator D1, a first terminal of the resistor R3 is connected to a neutral wire of a power supply source, a second terminal of the resistor R3 is connected to a negative electrode of the transmit terminal of the optoisolator D1, a positive electrode of the diode Q1 is connected to the first terminal of the resistor R3, a negative electrode of the diode Q1 is connected to the second terminal of the resistor R2, and a collector of a receive terminal of the optoisolator D1 is connected to the control unit by the resistor R4; the collector of the receive terminal of the optoisolator D1 is connected to a high-level signal by the resistor R5; and an emitter of the receive terminal of the optoisolator D1 is grounded and is connected to the control unit by the capacitor C1.

In an optional implementation of the first aspect, the controllable switch is a relay, and one terminal of the resistor R1 is connected to a normally open contact of a relay of a corresponding gear.

In an optional implementation of the first aspect, the detection unit further includes a power supply detection circuit, two input terminals of the power supply detection circuit are respectively connected to the live wire and the neutral wire of the alternating current power supply, an output terminal of the power supply detection circuit is connected to the control unit, the power supply detection circuit is configured to acquire a power supply source signal, and the power supply source signal includes a power supply voltage signal and a power supply frequency signal; and the control unit is further configured to determine the presence or absence of a power supply source according to the power supply voltage signal, and determine, according to the power supply frequency signal, a delay in controlling a controllable switch to be closed.

In an optional implementation of the first aspect, the power supply detection circuit includes a resistor R6, a resistor R7, a diode Q2, an optoisolator D2, a resistor R8, a resistor R9, a resistor R10, and a capacitor C2, one terminal of the resistor R6 is connected to the live wire of the alternating current power supply, the other terminal of the resistor R6 is connected to a first terminal of the resistor R7, a second terminal of the resistor R7 is connected to a positive electrode of a transmit terminal of the optoisolator D2, a first terminal of the resistor R8 is connected to the neutral wire of the alternating current power supply, a second terminal of the resistor R8 is connected to a negative electrode of the transmit terminal of the optoisolator D2, a positive electrode of the diode Q2 is connected to the first terminal of the resistor R8, a negative electrode of the diode Q2 is connected to the second terminal of the resistor R7, and a collector of a receive terminal of the optoisolator D2 is connected to the control unit by the resistor R9; the collector of the receive terminal of the optoisolator D2 is connected to a high-level signal by the resistor R10; and an emitter of the receive terminal of the optoisolator D2 is grounded and is connected to the control unit by the capacitor C2.

In an optional implementation of the first aspect, the gear control circuit further includes a rectifier, and the control unit is connected to the alternating current power supply by the rectifier.

In an optional implementation of the first aspect, the gear control circuit further includes a filter anti-interference unit, a ground wire of the alternating current power supply is connected to the alternating current motor by the filter anti-interference unit, the neutral wire of the alternating current power supply is connected to the alternating current motor and the rectifier by the filter anti-interference unit, and the live wire of the alternating current power supply is connected to the rectifier and an input terminal of the controllable switch by the filter anti-interference unit.

According to a second aspect, the present invention provides a gear control system for an alternating current motor, where the system includes an alternating current power supply, an alternating current motor, and the gear control circuit in any optional implementation of the first aspect, the alternating current motor includes a plurality of gears, the gears correspond to different motor rotation speeds, and controllable switches in the gear control circuit are connected to a live wire of the alternating current power supply and are connected to the plurality of gears of the alternating current motor in a one-to-one correspondence.

Because the gear control system of the foregoing design includes the gear control circuit of the foregoing design, the control unit may receive the target gear m inputted by the gear input unit, and the current gear n is determined by using the switching statuses of the controllable switches detected by the detection unit. Next, in a case that m is greater than n, the control unit controls controllable switches corresponding to all gears between n and m to be sequentially turned on in an ascending order of the gears and turns off a controllable switch corresponding to a gear i−1 after a controllable switch corresponding to a gear i is turned on; and in a case that m is less than n, the control unit controls controllable switches corresponding to all gears between m and n to be sequentially turned on in a descending order of the gears and turns off a controllable switch corresponding to a gear i+1 after a controllable switch corresponding to a gear i is turned on. With such a design, during gear switching, gears are gradually and sequentially switched, to make switching of gears smoother. The gradual gear switching generates a smaller inrush current compared with a one-step adjustment to a gear with too many gears skipped, thereby reducing the losses of the controllable switches and extending the service life of the controllable switches.

Another embodiment of the present invention provides a switch controller and an electronic device, thereby mitigating the problem that due to factors such as that a PWM signal has a small load and is unstable, a PWM signal is not conducive to controlling an electronic device to start or stop.

To achieve the foregoing objective, the embodiments of the present application are implemented in the following manners.

According to a first aspect, the embodiments of the present application provide a switch controller, where the switch controller includes a signal modulation circuit, a signal follower circuit, a comparison circuit, and a switch control circuit;

an input terminal of the signal modulation circuit is configured to receive a first PWM signal, and an output terminal of the signal modulation circuit is connected to an input terminal of the signal follower circuit, and is configured to output a second PWM signal representing an analog signal obtained by modulating the first PWM signal by the signal modulation circuit;

an output terminal of the signal follower circuit is connected to a first input terminal of the comparison circuit, and the signal follower circuit is configured to increase a current load power of the second PWM signal to a preset load power;

an output terminal of the comparison circuit is connected to an input terminal of the switch control circuit, and is configured to receive a reference signal at a second input terminal of the comparison circuit, and a control signal is outputted in a case that the first input terminal receives the second PWM signal; and an output terminal of the switch control circuit is connected to a control terminal of a device body of an electronic device, and the switch control circuit controls, in response to receiving the control signal, a switch device in the switch control circuit to be in an on state.

In the foregoing implementation, the switch controller may perform digital-to-analog conversion by using the signal modulation circuit, to modulate a first PWM signal being a digital signal into a second PWM signal being an analog signal, and then the signal follower circuit performs load amplification on the modulated second PWM signal, to avoid that the second PWM signal has a small load and cannot be used to control the on or off of the switch control circuit, thereby mitigating the problem that it is inconvenient to use a PWM signal to control an electronic device to start or stop.

With reference to the first aspect, in some optional implementations, the switch control circuit includes a first capacitor, a second capacitor, a third capacitor, a fourth capacitor, a first diode, a second diode, a first resistor, a second resistor, a third resistor, a triode, and a MOS transistor representing the switch device;

a first terminal of the first capacitor and a first terminal of the first resistor are connected to the output terminal of the comparison circuit, a second terminal of the first capacitor is grounded, a second terminal of the first resistor is connected to a base of the triode, an emitter of the triode is grounded, a collector of the triode is connected to a first terminal of the third resistor, a second terminal of the third resistor is connected to a first terminal of the second resistor and a first terminal of the MOS transistor, and a second terminal of the second resistor and a second terminal of the MOS transistor are both connected to an input terminal of a control power supply;

a first terminal of the first diode, a first terminal of the second capacitor, and a first terminal of the third capacitor are all connected to the input terminal of the control power supply, and a second terminal of the first diode, a second terminal of the second capacitor, and a second terminal of the third capacitor are all grounded;

a third terminal of the MOS transistor is used as the output terminal of the switch control circuit, the first terminal of the third resistor and a first terminal of the second diode are both connected to the third terminal of the MOS transistor, and the second terminal of the third resistor and a second terminal of the second diode are both grounded;

in a case that the triode receives the control signal through the first resistor, the second terminal of the MOS transistor and the third terminal of the MOS transistor are connected; and in a case that the triode does not receive the control signal through the first resistor, the second terminal of the MOS transistor and the third terminal of the MOS transistor are disconnected.

In the foregoing implementations, the triode and the MOS transistor cooperate with each other, so that whether the MOS transistor is turned on or off can be controlled based on whether the comparison circuit outputs the control signal, thereby implementing the on/off control of the electronic device. The power supply source of the electronic device is turned on when there is a PWM signal, and the power supply source is turned off when there is no PWM signal to reduce the power consumption of the electronic device, to avoid a waste of electrical energy as the power supply source is still on when there is no PWM signal.

With reference to the first aspect, in some optional implementations, the signal follower circuit includes a follower and a protection subcircuit, an input terminal of the follower is used as the input terminal of the signal follower circuit, an output terminal of the follower is connected to an input terminal of the protection subcircuit, an output terminal of the protection subcircuit is used as the output terminal of the signal follower circuit, and the protection subcircuit is configured to isolate and buffer the second PWM signal.

In the foregoing implementations, the follower may be used to increase the load of the second PWM signal, and the protection subcircuit may be used to isolate and buffer the PWM signal with the increased load, to output a safe and stable analog signal.

With reference to the first aspect, in some optional implementations, the comparison circuit includes a comparator, and a first input terminal of the comparator is configured to use a designated resistor to receive the second PWM signal outputted by the signal follower circuit;

a second input terminal of the comparator is configured to receive the reference signal; and an output terminal of the comparator is used as the output terminal of the comparison circuit.

In the foregoing implementations, the comparator may output the control signal according to the second PWM signal, so that the on/off control of the circuit may be implemented according to the control signal.

With reference to the first aspect, in some optional implementations, the switch controller further includes a magnetic ball, and the signal modulation circuit is configured to receive the first PWM signal through the magnetic ball.

In the foregoing implementations, the magnetic ball may be used to inhibit the interference of electromagnetic radiation, thereby helping to improve the stability of an inputted PWM signal.

With reference to the first aspect, in some optional implementations, the switch controller further includes a protection resistor, the output terminal of the signal follower circuit is connected to an input terminal of the comparison circuit by the protection resistor.

In the foregoing implementations, the protection resistor can ensure the stability of the transmitted second PWM signal, to prevent the second PWM signal from becoming unstable under the impact of the load.

With reference to the first aspect, in some optional implementations, the switch controller further includes a rectification module connected to the input terminal of the signal modulation circuit.

With reference to the first aspect, in some optional implementations, the switch controller further includes a voltage stabilizing circuit configured to perform voltage stabilization on the reference signal received by the comparison circuit.

According to a second aspect, the embodiments of the present application further provide an electronic device, the electronic device includes a device body and the foregoing switch controller, a control terminal of the device body is connected to an output terminal of the switch controller, where the device body is started in response to receiving a control signal outputted by the output terminal of the switch controller.

With reference to the second aspect, in some optional implementations, the device body includes a direct current motor.

BRIEF DESCRIPTION OF THE DRAWINGS

To describe the technical solutions in the embodiments of the present application more clearly, the following briefly introduces the accompanying drawings required for the embodiments of the present application. Apparently, the following accompanying drawings show merely some embodiments of the present application and therefore should not be considered as a limitation to the scope. A person of ordinary skill in the art may still derive other related drawings from these accompanying drawings without creative efforts.

Figure 1:
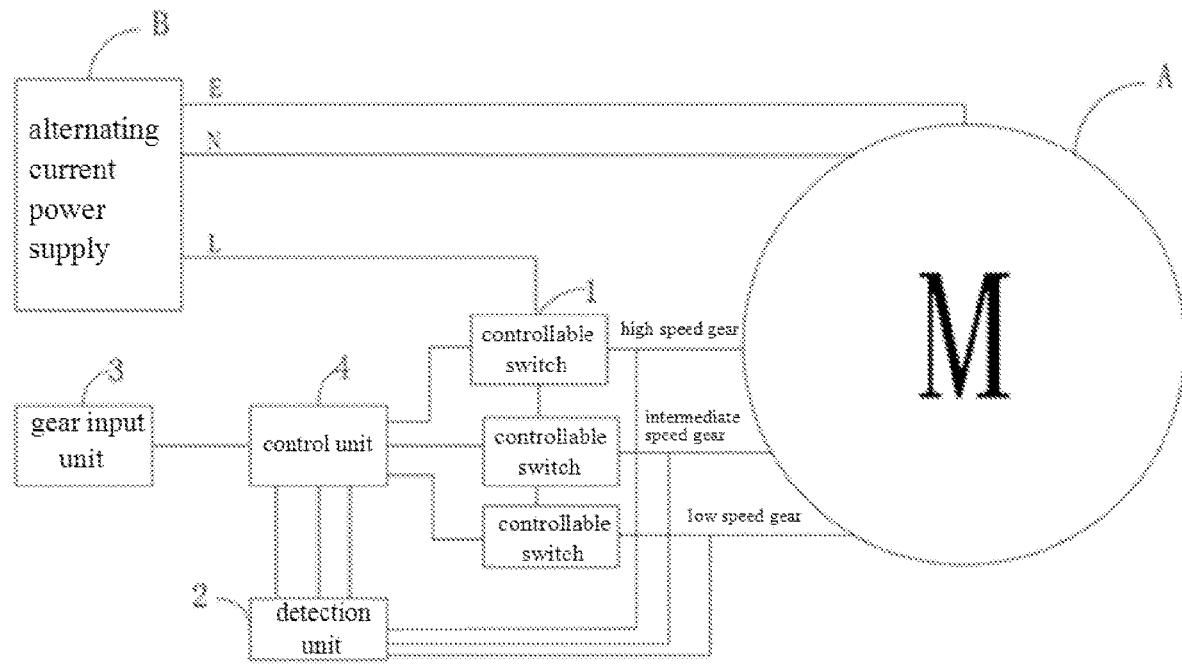
FIG. 1 is a first structural diagram of a gear control circuit according to an embodiment of the present application.

Reference Numerals: A—alternating current motor; B—alternating current power supply; L—live wire; N—neutral wire; E—ground wire; 1—controllable switch; 2—detection unit; 201—status detection circuit; 202—power supply detection circuit; 3—gear input unit; 4—control unit; 5—rectification unit; 6—filter anti-interference unit; 10—electronic device; 20—switch controller; 21—signal modulation circuit; 22—signal follower circuit; 23—comparison circuit; 24—switch control circuit; 25—voltage stabilizing circuit; 26—protection subcircuit; 27—rectification module; 30—device body; 100—signal source; 101—magnetic ball; 102—third diode; 103—fourth diode; 104—fifth capacitor; 105—sixth capacitor; 106—fourth resistor; 107—fifth resistor; 108—seventh capacitor; 109—follower; 110—eighth capacitor; 111—sixth resistor; 112—seventh resistor; 113—ninth capacitor; 114—eighth resistor; 115—tenth capacitor; 116—fifth diode; 117—sixth diode; 118—protection resistor; 120—tenth resistor; 121—comparator; 122—ninth resistor; 124—first diode; 125—first capacitor; 126—second capacitor; 127—third capacitor; 128—first resistor; 129—second resistor; 130—MOS transistor; 131—third resistor; 132—triode; 133—fourth capacitor; and 134—second diode.

DETAILED DESCRIPTION OF THE PREFERRED EMBODIMENTS

The following describes the technical solutions in embodiments of the present application with reference to the accompanying drawings in embodiments of the present application.

First Embodiment

Embodiments of the present application provide a gear control circuit for an alternating current motor. An alternating current motor A has a plurality of gears. Different gears correspond to different rotation speeds of the alternating current motor A. For example, a plurality of gears of the alternating current motor may include a low speed gear, an intermediate speed gear, and a high speed gear in an ascending order of the rotation speeds of the alternating current motor. As shown in FIG. 1, the gear control circuit of the present application includes a plurality of controllable switches 1, a detection unit 2, a gear input unit 3, and a control unit 4. The plurality of controllable switches 1 are connected to a live wire L of an alternating current power supply B and are connected to the plurality of gears of the alternating current motor A in a one-to-one correspondence. In a possible implementation, the quantity of the plurality of controllable switches 1 is the same as the quantity of the gears of the alternating current motor. For example, when the gears of the alternating current motor include a low speed gear, an intermediate speed gear, and a high speed gear, there are three controllable switches 1, and each gear is connected to one controllable switch 1.

The detection unit 2 is connected to the controllable switches 1, and is configured to detect switching statuses of the controllable switches 1, that is, detect whether each controllable switch is closed or open. The gear input unit 3 is configured to receive a target gear m inputted from outside. The control unit 4 is connected to the gear input unit 3, and is connected to the controllable switches 1 and the detection unit 2. The alternating current motor A is further connected to a neutral wire N and a ground wire E of the alternating current power supply B.

In the gear control circuit of the foregoing design, during running, the gear input unit 3 sends a target gear signal to the control unit 4. It is assumed that the target gear sent at this time is m. The signal of the gear input unit 3 may be generated by operating the gear input unit 3 by a worker to make an input. After the control unit 4 receives the target gear m, the control unit 4 may recognize a current gear n of the alternating current motor based on the switching statuses of the controllable switches 1 sent by the detection unit 2. The detection unit 2 may periodically feed back the detected switching statuses of the controllable switches 1 to the control unit 4.

After obtaining the target gear m and the current gear n, the control unit 4 may first determine a value relationship between m and n. If m is greater than n, it indicates that the gear needs to be increased at present. In this case, the control unit 4 may control controllable switches 1 corresponding to all gears between n and m to be sequentially turned on in an ascending order of the gears and turn off a controllable switch corresponding to a gear i−1 after a controllable switch corresponding to a gear i is turned on. If m is less than n, it indicates that the gear needs to be decreased at present. In this case, the control unit 4 may control controllable switches 1 corresponding to all gears between m and n to be sequentially turned on in a descending order of the gears and turn off a controllable switch 1 corresponding to a gear i+1 after a controllable switch 1 corresponding to a gear i is turned on.

The foregoing solution may be understood based on the following examples. In a case that m is greater than n, it is assumed that n=0 and m=3. That is, the motor is currently not started and the target gear is the third gear. The control unit may control the controllable switch 1 corresponding to every gear between the neutral gear and the third gear, and sequentially turn on the gears in an ascending order, that is, sequentially turn on the controllable switch corresponding to the first gear, the controllable switch corresponding to the second gear, and the controllable switch corresponding to the third gear. In addition, after the controllable switch corresponding to the second gear is turned on, the controllable switch corresponding to the first gear is turned off, and after the controllable switch corresponding to the third gear is turned on, the controllable switch corresponding to the second gear is turned off, so that it can be implemented that the alternating current motor is in a state of the third gear. In a case that m is less than n, it is assumed that n=3 and m=1. That is, the alternating current motor is currently in the third gear and the target gear is the first gear. The control unit 4 controls the controllable switch 1 corresponding to every gear between the third gear and the first gear, and sequentially turns on the gears in a descending order, that is, sequentially turns on the controllable switch corresponding to the second gear and the controllable switch corresponding to the first gear. In addition, after the controllable switch corresponding to the second gear is turned on, the controllable switch corresponding to the third gear is turned off, and after the controllable switch corresponding to the first gear is turned on, the controllable switch corresponding to the second gear is turned off.

In the gear control circuit of the foregoing design, the control unit receives the target gear m inputted by the gear input unit, and the current gear n is determined by using the switching statuses of the controllable switches detected by the detection unit. Next, in a case that m is greater than n, the control unit controls controllable switches corresponding to all gears between n and m to be sequentially turned on in an ascending order of the gears and turns off a controllable switch corresponding to a gear i−1 after a controllable switch corresponding to a gear i is turned on; and in a case that m is less than n, the control unit controls controllable switches corresponding to all gears between m and n to be sequentially turned on in a descending order of the gears and turns off a controllable switch corresponding to a gear i+1 after a controllable switch corresponding to a gear i is turned on. With such a design, during gear switching, gears are gradually and sequentially switched, to make switching of gears smoother. The gradual gear switching generates a smaller inrush current compared with a one-step adjustment to a gear with too many gears skipped, thereby reducing the losses of the controllable switches and extending the service life of the controllable switches.

Figure 2:
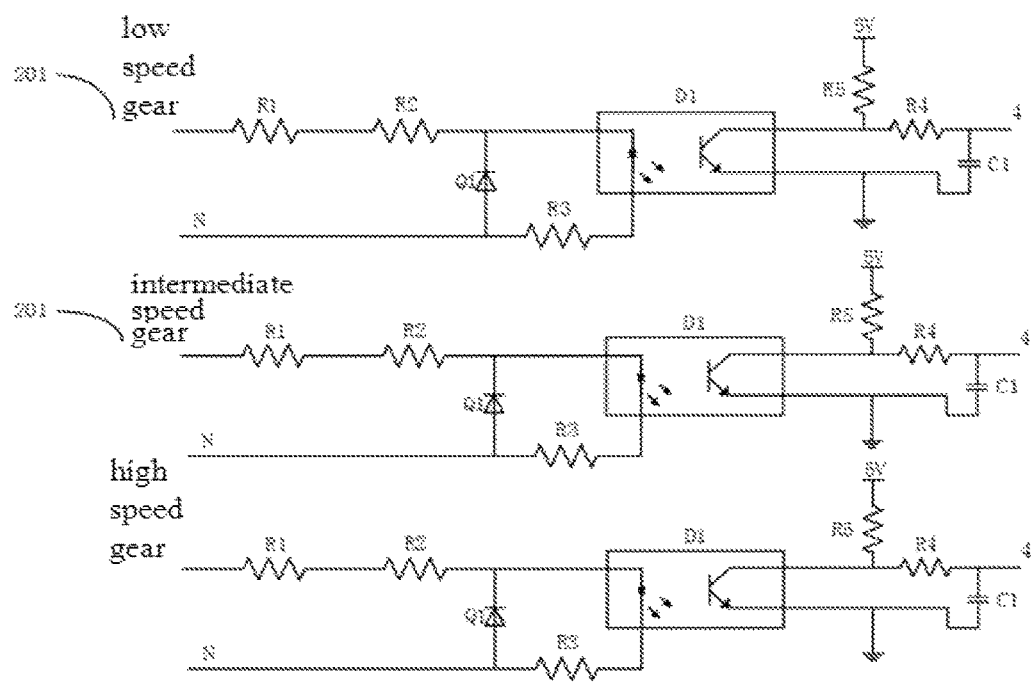
FIG. 2 is a specific circuit diagram of a detection unit according to an embodiment of the present application.

In an optional implementation of this embodiment, as shown in FIG. 2, the detection unit 2 includes a plurality of status detection circuits 201. Each of the plurality of status detection circuits 201 includes two input terminals and one output terminal. The two input terminals of each of the plurality of status detection circuits 201 are respectively connected to one controllable switch 1 and a neutral wire N of the alternating current power supply B, to detect the switching status of the correspondingly connected controllable switch 1. The control unit 4 is connected to an output terminal of each status detection circuit 201 and configured to receive the switching statuses of the controllable switches, and in response to determining, according to the switching statuses of the controllable switches, that only one controllable switch is in a closed state, a gear corresponding to the controllable switch in a closed state is determined as the current gear n of the alternating current motor.

In a possible implementation, as shown in FIG. 2, each status detection circuit 201 includes a resistor R1, a resistor R2, a diode Q1, an optoisolator D1, a resistor R3, a resistor R4, a resistor R5, and a capacitor C1. One terminal of the resistor R1 is connected to an output terminal of a controllable switch of a corresponding gear. The other terminal of the resistor R1 is connected to a first terminal of the resistor R2. A second terminal of the resistor R2 is connected to a positive electrode of a transmit terminal of the optoisolator D1. A first terminal of the resistor R3 is connected to a neutral wire N of a power supply source. A second terminal of the resistor R3 is connected to a negative electrode of the transmit terminal of the optoisolator D1. A positive electrode of the diode Q1 is connected to the first terminal of the resistor R3. A negative electrode of the diode Q1 is connected to the second terminal of the resistor R2. A collector of a receive terminal of the optoisolator D1 is connected to the control unit 4 by the resistor R4. The collector of the receive terminal of the optoisolator D1 is connected to a high-level signal by the resistor R5. An emitter of the receive terminal of the optoisolator D1 is grounded and is connected to the control unit 4 by the capacitor C1. In a possible implementation, the controllable switch 1 may be specifically a relay, and one terminal of the resistor R1 is connected to a normally open contact of a relay of a corresponding gear. It needs to be noted that in addition to using the foregoing circuit structure to implement the status detection circuit 201, another existing status detection structure may be used as the status detection circuit 201.

In the status detection circuit of the foregoing design, when a controllable switch 1 connected to the status detection circuit 201 is off, the optoisolator D1 in the status detection circuit 201 is not turned on, and the status detection circuit 201 transmits a low-level signal to the control unit 4. When a controllable switch 1 connected to the status detection circuit 201 is closed, the status detection circuit 201 may receive a high-level signal from an output terminal of the controllable switch 1, to turn on the optoisolator D1 in the status detection circuit 201, so that the status detection circuit 201 sends a high-level signal to the control unit 4, so that based on the high-level signal, the control unit 4 can know that the controllable switch correspondingly connected to the status detection circuit 201 is closed. Based on the foregoing principle, during the recognition of a current gear, the control unit 4 may obtain level signals transmitted by all the status detection circuits 201 to recognize switching statuses of the controllable switches correspondingly connected to the status detection circuits 201, so that when it is determined that only one controllable switch 1 is in a closed state, a gear corresponding to the controllable switch in a closed state is determined as the current gear n of the alternating current motor.

In a possible implementation, after recognizing the switching statuses of the controllable switches correspondingly connected to the status detection circuits 201, the control unit 4 recognizes that all the controllable switches 1 are in an off state. In this case, the control unit 4 determines that the alternating current motor is not started. After recognizing the switching statuses of the controllable switches correspondingly connected to the status detection circuits 201, the control unit 4 recognizes that two or more controllable switches 1 are all in a closed state for a long time. In this case, the control unit 4 determines that the running of the alternating current motor encounters a fault and can further raise an alarm automatically.

Figure 3:
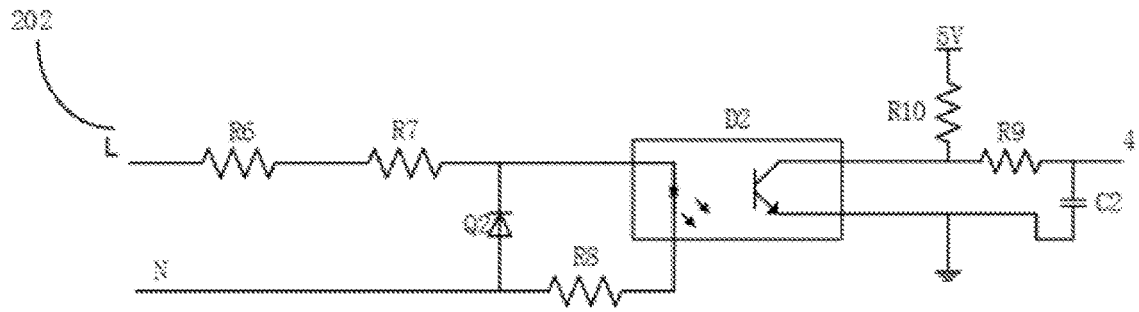
FIG. 3 is a specific structural diagram of a power supply detection circuit according to an embodiment of the present application.

In an optional implementation of this embodiment, as shown in FIG. 3, the detection unit 2 further includes a power supply detection circuit 202. The structure of the power supply detection circuit 202 is completely consistent with that of the status detection circuit 201. The power supply detection circuit specifically includes a resistor R6, a resistor R7, a diode Q2, an optoisolator D2, a resistor R8, a resistor R9, a resistor R10, and a capacitor C2. One terminal of the resistor R6 is connected to the live wire L of the alternating current power supply B. The other terminal of the resistor R6 is connected to a first terminal of the resistor R7. A second terminal of the resistor R7 is connected to a positive electrode of a transmit terminal of the optoisolator D2. A first terminal of the resistor R8 is connected to the neutral wire N of the alternating current power supply B. A second terminal of the resistor R8 is connected to a negative electrode of the transmit terminal of the optoisolator D2. A positive electrode of the diode Q2 is connected to the first terminal of the resistor R8. A negative electrode of the diode Q2 is connected to the second terminal of the resistor R7. A collector of a receive terminal of the optoisolator D2 is connected to the control unit by the resistor R9. The collector of the receive terminal of the optoisolator D2 is connected to a high-level signal by the resistor R10. An emitter of the receive terminal of the optoisolator D2 is grounded and is connected to the control unit 4 by the capacitor C2.

A difference between the power supply detection circuit 202 and the status detection circuit 201 lies in that the two input terminals of the power supply detection circuit 202 are respectively connected to the live wire L and the neutral wire N of the alternating current power supply B. The power supply detection circuit 202 is configured to acquire a power supply source signal, and transmits the power supply source signal to the control unit 4. The power supply source signal includes a power supply frequency. The control unit 4 may determine the presence or absence of a power supply source according to a power supply voltage signal transmitted by the power supply detection circuit 202, and determine, according to the power supply frequency, a delay in controlling a controllable switch 1 to be closed. For example, during gear adjustment, a controllable switch of a gear needs to be controlled to be closed. Because the power supply source is commercial power, that is, alternating current power of 50 HZ, the optimal timing for closing is that the controllable switch is turned on or off when a waveform of the commercial power passes through the horizontal coordinate, that is, when the horizontal coordinate is 0, and damage to the controllable switch is minimized.

Figure 4:
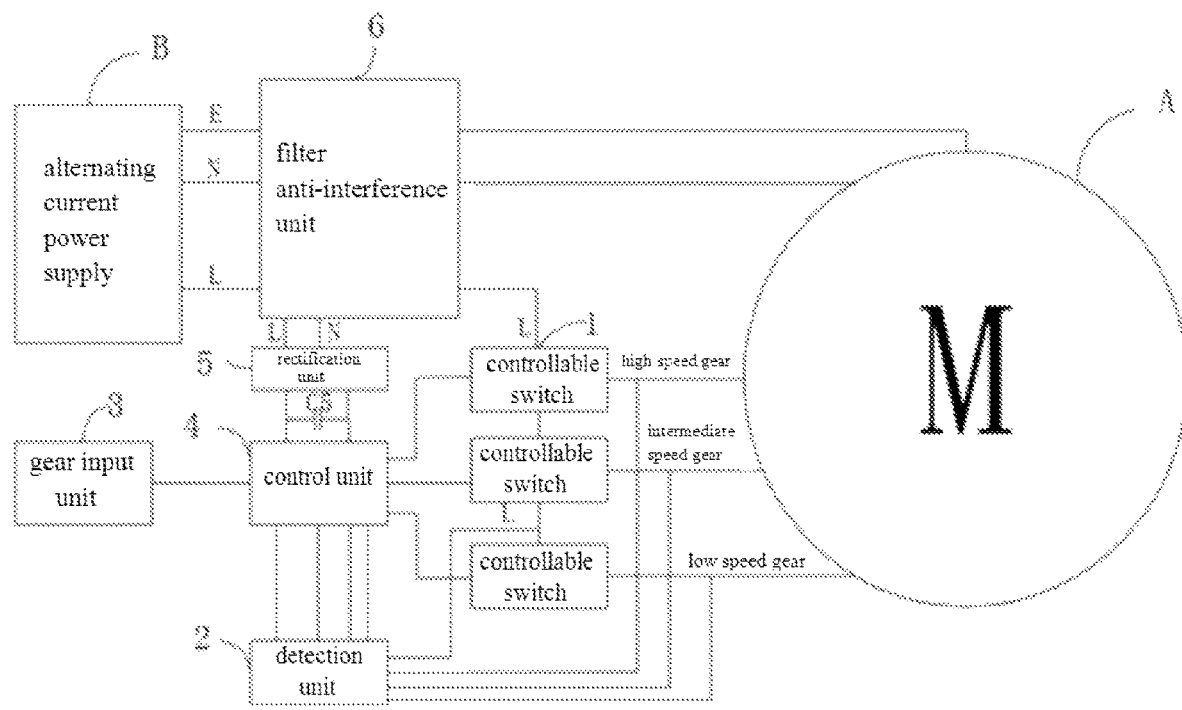
FIG. 4 is a second structural diagram of a gear control circuit according to an embodiment of the present application.

In an optional implementation of this embodiment, as shown in FIG. 4, the gear control circuit further includes a rectification unit 5. The control unit 4 is connected to the alternating current power supply B by the rectification unit 5, so that the control unit 4 may use the rectification unit 5 to convert the alternating current power of the alternating current power supply B into direct current power for the control unit to operate. In addition, apart from the foregoing manner, the control unit 4 may be directly connected to one direct current power supply, to supply power to the control unit 4. In a possible implementation, the rectification unit 5 may be specifically a rectifier or another component that can convert alternating current power into direct current power.

In a possible implementation, as shown in FIG. 4, a supercapacitor C5 is connected in parallel between the rectification unit 5 and the control unit 4, to allow the control unit 4 to keep raising an alarm for a period of time in a case that an external voltage disappears.

In an optional implementation of this embodiment, as shown in FIG. 4, the gear control circuit further includes a filter anti-interference unit 6. A ground wire of the alternating current power supply B is connected to the alternating current motor A by the filter anti-interference unit 6. A neutral wire N of the alternating current power supply B is connected to the alternating current motor A and the rectification unit 5 by the filter anti-interference unit 6. A live wire L of the alternating current power supply B is connected to the rectification unit 5 and an input terminal of a controllable switch 1 by the filter anti-interference unit 6.

Figure 5:
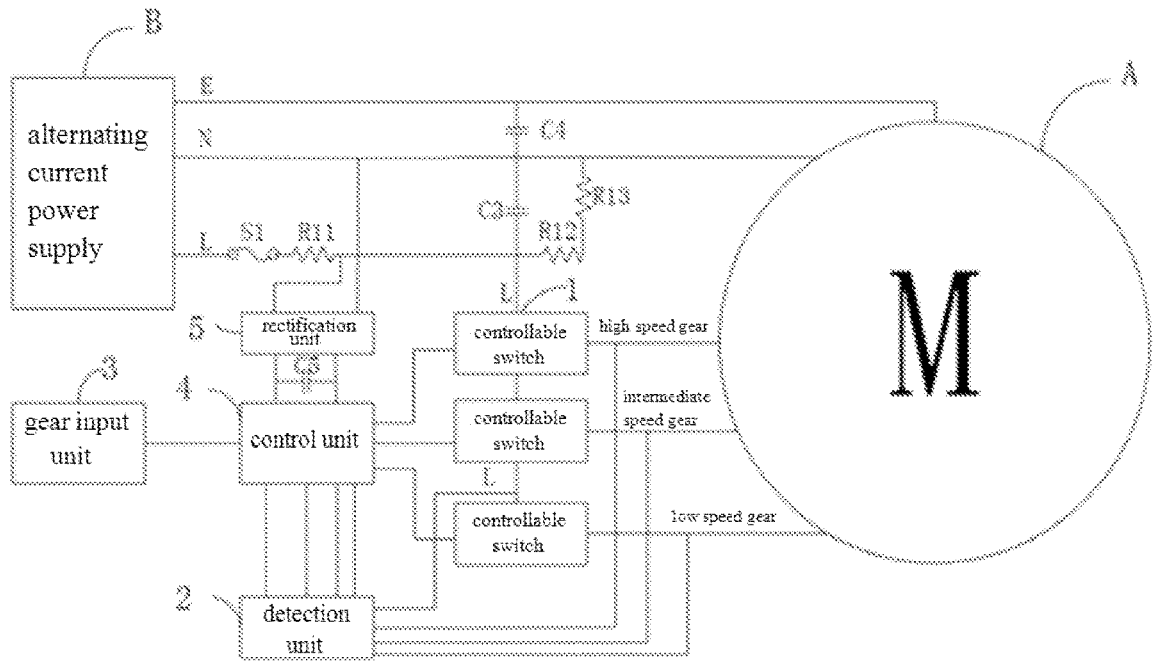
FIG. 5 is a third structural diagram of a gear control circuit according to an embodiment of the present application.

In a possible implementation, as shown in FIG. 5, the filter anti-interference unit 6 includes a fuse S1, a resistor R11, a resistor R12, a resistor R13, a capacitor C3, and a capacitor C4. One terminal of the fuse S1 is connected to the live wire L of the alternating current power supply B. The other terminal of the fuse S1 is connected to a first terminal of the resistor R11. A second terminal of the resistor R11 is connected to the rectification unit 5 and a second terminal of the capacitor C3. A first terminal of the capacitor C3 is connected to the neutral wire N of the alternating current power supply B. The neutral wire N of the alternating current power supply B is connected to the alternating current motor A. A first terminal of the capacitor C4 is connected to the first terminal of the capacitor C3. A second terminal of the capacitor C4 is connected to the ground wire E of the alternating current power supply B. A first terminal of the resistor R12 is connected to the second terminal of the capacitor C3. A second terminal of the resistor R12 is connected to the neutral wire N of the alternating current power supply B by the resistor R13. Apart from using the foregoing circuit structure to implement the filter anti-interference unit 6, another existing filter anti-interference structure may be used as the filter anti-interference unit 6.

In the foregoing implementations, the resistor R11 is a thermistor and implements overcurrent protection and overheat detection in the circuit. The capacitor C3 is configured to inhibit EMI conduction interference, eliminate a spark circuit, and the like. The resistor R12 and the resistor R13 may ensure that a voltage of a power supply plug is reduced below 36 V within 1 s after unplugging to protect physical safety.

Second Embodiment

The present application provides a gear control system for an alternating current motor. The system includes an alternating current power supply B, an alternating current motor A, and the gear control circuit in any optional implementation of the first embodiment. The controllable switches 1 in the gear control circuit are connected to the alternating current power supply B and are connected to a plurality of gears of the alternating current motor A in a one-to-one correspondence. The principle of the gear control system in this embodiment is consistent with the gear control circuit described in the first embodiment. Details are not described again.

Because the gear control system of the foregoing design includes the gear control circuit of the foregoing design, the control unit may receive the target gear m inputted by the gear input unit, and the current gear n is determined by using the switching statuses of the controllable switches detected by the detection unit. Next, in a case that m is greater than n, the control unit controls controllable switches corresponding to all gears between n and m to be sequentially turned on in an ascending order of the gears and turns off a controllable switch corresponding to a gear i−1 after a controllable switch corresponding to a gear i is turned on; and in a case that m is less than n, the control unit controls controllable switches corresponding to all gears between m and n to be sequentially turned on in a descending order of the gears and turns off a controllable switch corresponding to a gear i+1 after a controllable switch corresponding to a gear i is turned on. With such a design, during gear switching, gears are gradually and sequentially switched, to make switching of gears smoother. The gradual gear switching generates a smaller inrush current compared with a one-step adjustment to a gear with too many gears skipped, thereby reducing the losses of the controllable switches and extending the service life of the controllable switches.

In the embodiments provided in the present application, it should be understood that the disclosed apparatus and method may be implemented in other forms. The described apparatus embodiment is merely an example. For example, the unit division is merely logical function division and may be other division in actual implementation. In another example, a plurality of units or components may be combined or integrated into another system, or some features may be ignored or not performed. In addition, the shown or discussed mutual couplings or direct couplings or communication connections between the components may be implemented through some communication interfaces, indirect couplings or communication connections between the apparatuses or units, or electrical connections, mechanical connections, or connections in other forms.

In addition, the units described as separate parts may or may not be physically separate, and parts shown as units may or may not be physical units, that is, may be located in one position, or may be distributed on a plurality of network units. Some or all of the units may be selected according to actual needs to achieve the objects of the solutions in the embodiments.

Moreover, functional modules in the embodiments of the present application may be integrated together to form one independent part, or each of the modules may exist alone, or two or more modules are integrated to form one independent part.

The relational terms herein such as "first" and "second" are used only to differentiate an entity or operation from another entity or operation, and do not require or imply any actual relationship or sequence between these entities or operations.

Third Embodiment

Referring to FIG. 6 to FIG. 11 together, this embodiment of the present application provides a switch controller 20, which can use a PWM signal to control a device body 30 of an electronic device 10 to start or stop, thereby helping to reduce the energy consumption of the electronic device 10.

Figure 6:
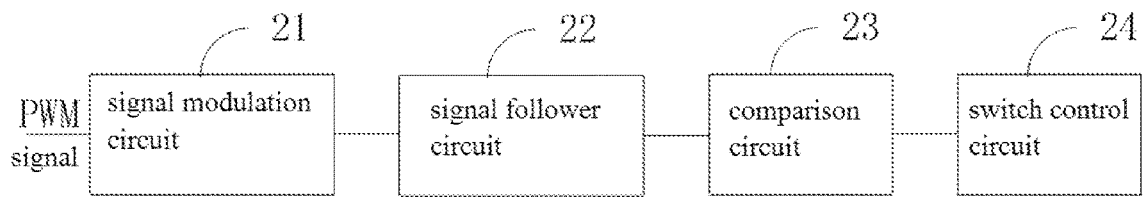
FIG. 6 is a schematic diagram of a circuit module of a switch controller according to an embodiment of the present application.

Referring to FIG. 6, the switch controller 20 may include a signal modulation circuit 21, a signal follower circuit 22, a comparison circuit 23, and a switch control circuit 24.

An input terminal of the signal modulation circuit 21 is configured to receive a first PWM signal. An output terminal of the signal modulation circuit 21 is connected to an input terminal of the signal follower circuit 22, and is configured to output a second PWM signal representing an analog signal obtained by modulating the first PWM signal by the signal modulation circuit 21. The first PWM signal may be generated by a signal source 100. A manner in which the signal source 100 generates a PWM signal is known to a person skilled in the art. Details are not described again. The PWM signal generated by the signal source 100 is the first PWM signal, and may be outputted to the input terminal of the signal modulation circuit 21. The first PWM signal is modulated by the signal modulation circuit 21, and the obtained signal is the second PWM signal.

When the device body 30 is a motor, the first PWM signal may be outputted to the motor, and the motor controls a motor rotation speed according to the PWM signal. A manner in which the motor controls a motor rotation speed according to the PWM signal is known to a person skilled in the art. Details are not described again.

An output terminal of the signal follower circuit 22 is connected to a first input terminal of the comparison circuit 23. The signal follower circuit 22 is configured to increase a current load power of the second PWM signal to a preset load power. The preset load power may be set according to an actual requirement. This is not specifically limited here. The signal follower circuit 22 may be used to keep the voltage of the second PWM signal unchanged and increase the current, thereby improving the load capability of the second PWM signal. It may be understood that the signal follower circuit 22 may be used to buffer and isolate the second PWM signal and improve the loading capability of the signal.

An output terminal of the comparison circuit 23 is connected to an input terminal of the switch control circuit 24, and is configured to receive a reference signal at a second input terminal of the comparison circuit 23, and a control signal is outputted in a case that the first input terminal receives the second PWM signal. A reference signal of the comparison circuit 23 may be a reference voltage. A user may set the reference voltage according to an actual requirement. The reference voltage is a threshold level of the comparison circuit 23.

An output terminal of the switch control circuit 24 is connected to a control terminal of a device body 30 of an electronic device 10. The switch control circuit 24 controls, in response to receiving the control signal, a switch device in the switch control circuit 24 to be in an on state. A switch device of the switch control circuit 24 is electrically connected to a control terminal on the device body 30. After the switch device is turned on, the device body 30 may be powered on through the control terminal, to start the device body 30. The control signal may be a level signal, and may be a level signal such as a high-level signal or a low-level signal, and may be set according to an actual case.

In the foregoing implementation, the switch controller 20 may perform digital-to-analog conversion by using the signal modulation circuit 21, to modulate a first PWM signal being a digital signal into a second PWM signal being an analog signal. Then the signal follower circuit 22 performs load amplification on the modulated second PWM signal, to avoid that the second PWM signal has a small load and cannot be used to control the on or off of the switch control circuit 24, thereby mitigating the problem that it is inconvenient to use a PWM signal to control the electronic device 10 to start or stop.

Figure 9:
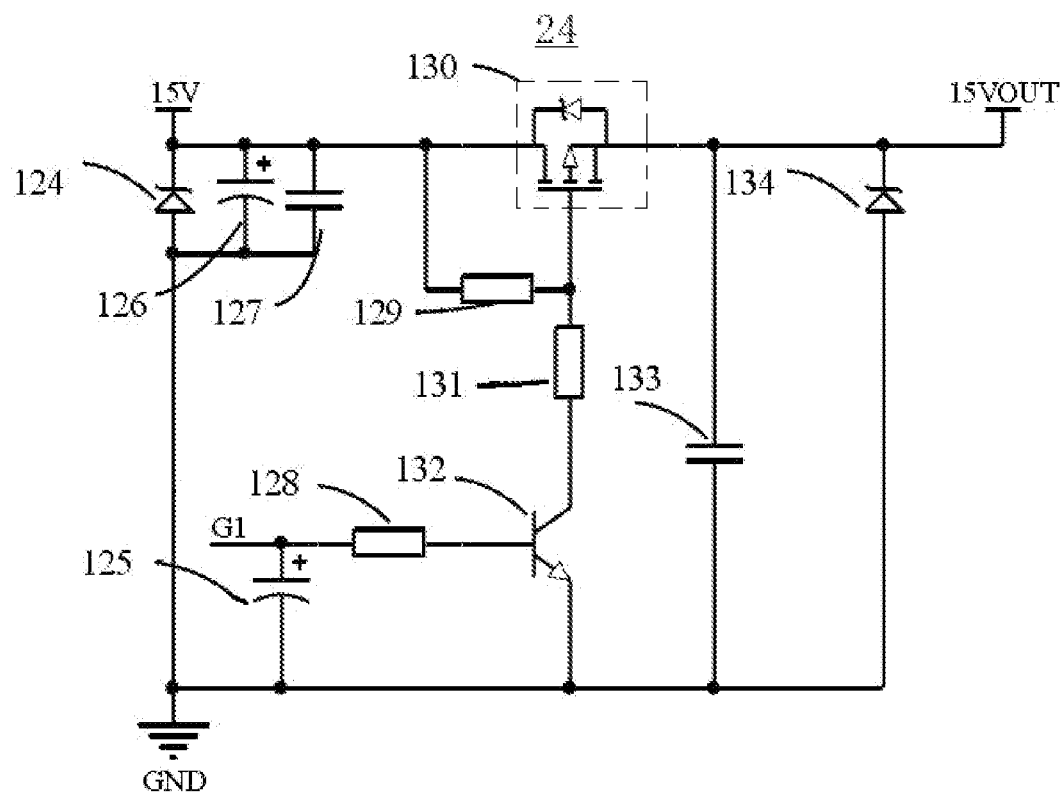
FIG. 9 is a schematic diagram of a switch control circuit according to an embodiment of the present application.

Referring to FIG. 9, in this embodiment, the switch control circuit 24 may include a first capacitor 125, a second capacitor 126, a third capacitor 127, a fourth capacitor 133, a first diode 124, a second diode 134, a first resistor 128, a second resistor 129, a third resistor 131, a triode 132, and a MOS transistor 130 representing the switch device.

A first terminal of the first capacitor 125 and a first terminal of the first resistor 128 are connected to the output terminal of the comparison circuit 23. A second terminal of the first capacitor 125 is grounded. A second terminal of the first resistor 128 is connected to a base of the triode 132. An emitter of the triode 132 is grounded. A collector of the triode 132 is connected to a first terminal of the third resistor 131. A second terminal of the third resistor 131 is connected to a first terminal of the second resistor 129 and a first terminal of the MOS transistor 130. A second terminal of the second resistor 129 and a second terminal of the MOS transistor 130 are both connected to an input terminal of a control power supply.

A first terminal of the first diode 124, a first terminal of the second capacitor 126, and a first terminal of the third capacitor 127 are all connected to the input terminal of the control power supply. A second terminal of the first diode 124, a second terminal of the second capacitor 126, and a second terminal of the third capacitor 127 are all grounded.

A third terminal of the MOS transistor 130 is used as the output terminal of the switch control circuit 24. The first terminal of the third resistor 131 and a first terminal of the second diode 134 are both connected to the third terminal of the MOS transistor 130. The second terminal of the third resistor 131 and a second terminal of the second diode 134 are both grounded.

In a case that the triode 132 receives the control signal through the first resistor 128, the second terminal of the MOS transistor 130 and the third terminal of the MOS transistor 130 are connected.

In a case that the triode 132 does not receive the control signal through the first resistor 128, the second terminal of the MOS transistor 130 and the third terminal of the MOS transistor 130 are disconnected.

In this embodiment, a comparator 121 may be a voltage comparator. A level signal outputted by the comparator 121 is a G1 signal.

In the switch control circuit 24, the control power supply may be a 15-V power supply, and is known to a person skilled in the art. A source and a drain of the MOS transistor 130 may be used as switches of the control power supply. The G1 signal may use the first resistor 128 to control the on or off of the NPN triode 132, thereby stably controlling the on or off of a PMOS.

The triode 132 may be an NPN triode 132, and the MOS transistor 130 may be a PMOS transistor. In this case, the reference signal may be a high-level signal. When the switch controller 20 keeps receiving the first PWM signal and a base of the NPN triode is at a high level, a collector and an emitter of the triode 132 are turned on, and a current flow direction is from the collector to the emitter. When a gate (or referred to as a G terminal) of the PMOS transistor is at a low level, a source (or referred to as an S terminal) and a drain (or referred to as a D terminal) of the PMOS transistor are turned on, and the current flow direction is from the source to the drain, so that a control terminal of the device body 30 can be powered on to be started.

When the switch controller 20 does not receive the first PWM signal, the base of the NPN triode is at a low level. In this case, the collector and the emitter of the triode 132 are disconnected. In addition, the source and drain of the PMOS transistor are disconnected, so that the control terminal of the device body 30 are powered off to be turned off, thereby reducing the energy consumption of the electronic device 10.

The second resistor 129 is configured to disconnect the power supply when the NPN triode is not turned on.

The third resistor 131 is configured to protect the triode 132.

The first capacitor 125 may be a polarized capacitor of an electrolytic capacitor type, and is configured to stabilize the G1 signal.

The second capacitor 126 may be an electrolytic capacitor, and is configured to stabilize a power supply voltage.

The third capacitor 127 may be a non-polarized capacitor of a ceramic capacitor type, and is configured to eliminate the interference from the power supply.

The fourth capacitor 133 may be a non-polarized capacitor, and is configured to improve the stability of an outputted signal.

The first diode 124 and the second diode 134 are configured to protect a subsequent load from the impact of an overvoltage or overcurrent and also protect the device body 30.

In the foregoing implementations, the triode 132 and the MOS transistor 130 cooperate with each other, so that whether the MOS transistor 130 is turned on or off can be controlled based on whether the comparison circuit 23 outputs the control signal, thereby implementing the on/off control of the electronic device 10. The power supply source of the electronic device 10 is turned on when there is a PWM signal, and the power supply source is turned off when there is no PWM signal to reduce the power consumption of the electronic device 10, to avoid a waste of electrical energy as the power supply source is still on when there is no PWM signal.

Figure 7:
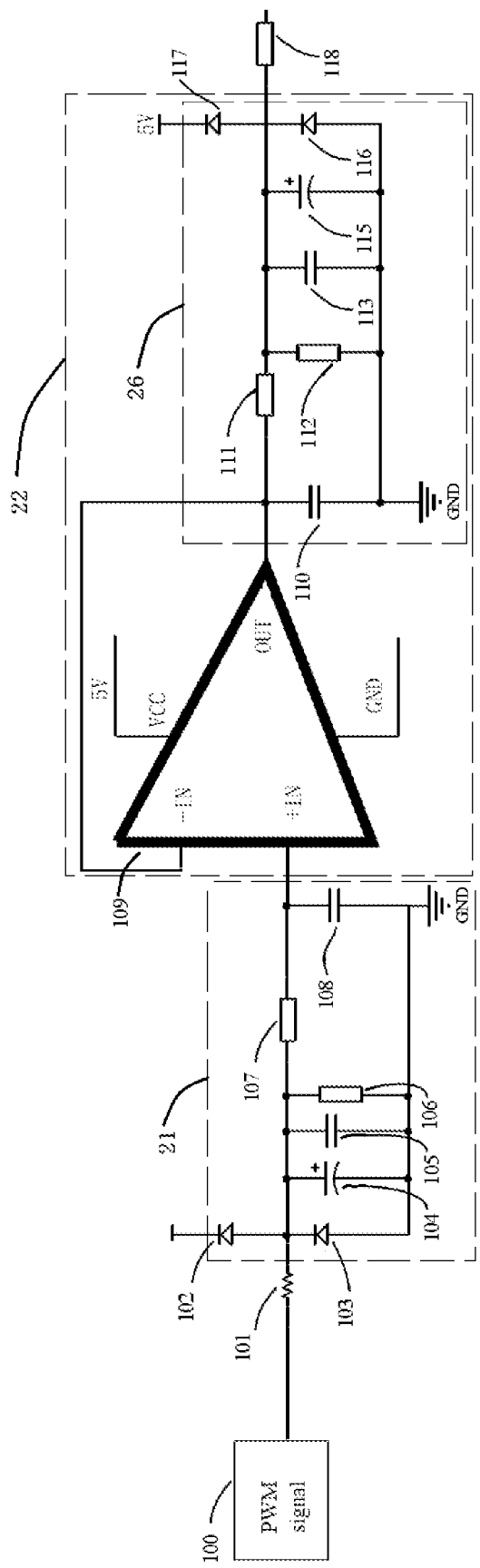
FIG. 7 is a schematic diagram of a connection between a signal modulation circuit and a signal follower circuit in a switch controller according to an embodiment of the present application.

Referring to FIG. 7, in this embodiment, the signal modulation circuit 21 may include a third diode 102, a fourth diode 103, a fifth capacitor 104, a sixth capacitor 105, a seventh capacitor 108, a fourth resistor 106, and a fifth resistor 107. A negative electrode of the third diode 102 is connected to a first power supply. A positive electrode of the third diode 102 is connected to a first terminal of the fifth resistor 107. After being connected to a first terminal of the seventh capacitor 108, a second terminal of the fifth resistor 107 is used as the output terminal of the signal modulation circuit 21. A second terminal of the seventh capacitor 108 is grounded. The first power supply may be a 5-V power supply, and is known to a person skilled in the art.

A negative electrode of the fourth diode 103, a first terminal of the fifth capacitor 104, a first terminal of the sixth capacitor 105, and a first terminal of the fourth resistor 106 are all connected to the positive electrode of the third diode 102 and the first terminal of the fifth resistor 107. A positive electrode of the fourth diode 103, a second terminal of the fifth capacitor 104, a second terminal of the sixth capacitor 105, and a second terminal of the fourth resistor 106 are grounded.

In the signal modulation circuit 21, the third diode 102 and the fourth diode 103 provide protection to keep an inputted voltage less than or equal to the voltage of the power supply source to avoid a negative voltage, thereby ensuring the safety of the subsequent circuit.

The fifth capacitor 104 and the sixth capacitor 105 cooperate with each other to convert the first PWM signal into a direct current signal.

The fifth capacitor 104 may be a polarized capacitor (for example, an electrolytic capacitor). The sixth capacitor 105 may be a non-polarized capacitor (for example, a ceramic capacitor), and may be configured to absorb low-frequency interference.

The fifth resistor 107 is configured to eliminate a reflected signal. According to the theory of operational amplification, the input impedance of the fifth resistor is infinitely great, an input pin current approximates 0. Therefore, a current inputted by the PWM signal flows to the ground through the resistor 106. Without this fifth resistor 107, the signal is reflected back to the output of a magnetic ball 101. If an inputted signal of the PWM signal has a low loading capability, an oscillation signal is formed, and as a result a subsequently outputted signal is unstable.

The seventh capacitor 108 is configured to absorb a reflected signal more effectively. The fifth resistor 107 may block a reflected high-frequency signal at an input terminal of a follower 109, and the seventh capacitor 108 absorbs the high-frequency signal, to filter out an interference signal of an inputted signal of the follower 109, thereby ensuring the quality of the inputted signal of the follower 109.

Referring to FIG. 7, in this embodiment, the signal follower circuit 22 may include a follower 109 and a protection subcircuit 26. An input terminal of the follower 109 is used as the input terminal of the signal follower circuit 22. An output terminal of the follower 109 is connected to an input terminal of the protection subcircuit 26. An output terminal of the protection subcircuit 26 is used as the output terminal of the signal follower circuit 22. The protection subcircuit 26 is configured to isolate and buffer the second PWM signal.

The follower 109 may be a voltage follower, and is configured to ensure that the voltage of the second PWM signal inputted into the follower 109 and the voltage of the second PWM signal outputted from the follower 109 are kept unchanged, and the current of the outputted PWM signal is increased.

Referring to FIG. 7 again, the follower 109 includes a first input terminal "+IN", a second input terminal "−IN", a power terminal VCC, a grounding terminal GND, and an output terminal OUT. The first input terminal "+IN" of the follower 109 is used as the input terminal of the signal follower circuit 22, and may be connected to the second terminal of the fifth resistor 107. The second input terminal "−IN" of the follower 109 is connected to the output terminal OUT of the follower 109. The power terminal VCC of the follower 109 is connected to a second power supply. The second power supply may be a 5-V power supply, and is known to a person skilled in the art. The grounding terminal GND of the follower 109 is grounded. The output terminal OUT of the follower 109 is connected to the input terminal of the protection subcircuit 26.

The protection subcircuit 26 includes a sixth resistor 111, a seventh resistor 112, an eighth capacitor 110, a ninth capacitor 113, a tenth capacitor 115, a fifth diode 116, and a sixth diode 117.

A first terminal of the sixth resistor 111 is connected to a first terminal of the eighth capacitor 110, and is used as the input terminal of the protection subcircuit 26. The input terminal is connected to the output terminal OUT of the follower 109. A second terminal of the sixth resistor 111 is connected to a first terminal of the seventh resistor 112, a first terminal of the ninth capacitor 113, a first terminal of the tenth capacitor 115, a negative electrode of the fifth diode 116, and a positive electrode of the sixth diode 117. A second terminal of the seventh resistor 112, a second terminal of the ninth capacitor 113, a second terminal of the tenth capacitor 115, and a positive electrode of the fifth diode 116 are all grounded. A negative electrode of the sixth diode 117 is connected to a third power supply. The third power supply may be a 5-V power supply, and is known to a person skilled in the art. The second terminal of the sixth resistor 111 may be used as the output terminal of the protection subcircuit 26, and outputs the isolated and buffered second PWM signal.

The sixth resistor 111 is used for isolating a capacitive load of operational amplification, and in addition may eliminate a phase lag generated in a feedback loop. For example, based on the sixth resistor 111, a relatively heavy load of the PWM signal does not cause the oscillation of the system, thereby improving the stability of signals in the circuit.

The seventh resistor 112, the ninth capacitor 113, and the tenth capacitor 115 are all used for stabilizing signals to avoid the impact from the load.

The eighth capacitor 110 is configured to eliminate a phase lag caused by a subsequent load.

The fifth diode 116 and the sixth diode 117 provide protection to keep an inputted voltage less than or equal to the voltage of the power supply to avoid a negative voltage, thereby ensuring the safety and stability of previous and subsequent circuits.

In the foregoing implementations, the follower 109 may be used to increase the load of the second PWM signal, and the protection subcircuit 26 may be used to isolate and buffer the PWM signal with the increased load, to output a safe and stable analog signal.

Figure 8:
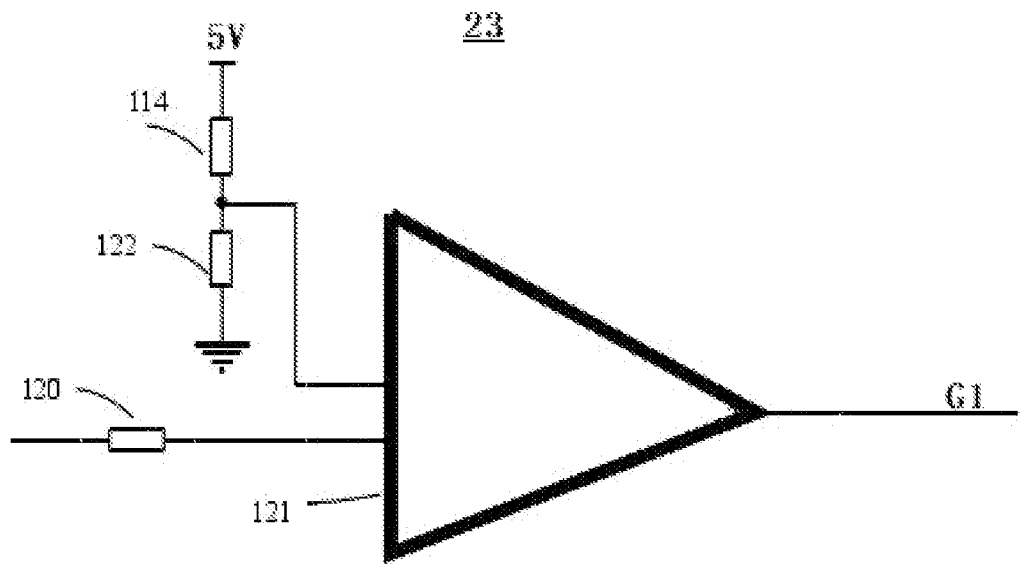
FIG. 8 is a schematic diagram of a comparison circuit according to an embodiment of the present application.

Referring to FIG. 8, in this embodiment, the comparison circuit 23 includes the comparator 121. A first input terminal of the comparator 121 is configured to use a designated resistor to receive the second PWM signal outputted by the signal follower circuit 22. A second input terminal of the comparator 121 is configured to receive the reference signal. An output terminal of the comparator 121 is used as the output terminal of the comparison circuit 23.

In this embodiment, the second input terminal of the comparator 121 may be connected to a fourth power supply by an eighth resistor 114. In addition, the fourth power supply may be grounded through the eighth resistor 114 and a ninth resistor 122. The fourth power supply may be a 5-V power supply, and is known to a person skilled in the art.

The designated resistor is a tenth resistor 120. The first input terminal of the comparator 121 uses the tenth resistor 120 to receive the second PWM signal outputted by the signal follower circuit 22. Then the comparator 121 outputs the G1 signal to the input terminal of the switch control circuit 24 through the output terminal according to the signals received by the first input terminal and the second input terminal.

The eighth resistor 114 and the ninth resistor 122 are configured to adjust a voltage (a threshold level) of a reference signal of the comparator 121, so that a high level is outputted when there is an input of the second PWM signal at the first input terminal of the comparator 121. When the input terminal of the comparator 121 does not receive the second PWM signal, a low level is outputted.

The tenth resistor 120 is configured to isolate the interference between the signal outputted by the signal follower circuit 22 and the input terminal of the comparator 121.

In the foregoing implementations, the comparator 121 may output the control signal according to the second PWM signal, so that the on/off control of the circuit may be implemented according to the control signal.

Referring to FIG. 7 again, in some optional implementations, the switch controller 20 may further include a magnetic ball 101. The signal modulation circuit 21 is configured to receive the first PWM signal through the magnetic ball 101.

In the foregoing implementations, the magnetic ball 101 may be used to inhibit the interference of electromagnetic radiation, thereby helping to improve the stability of an inputted PWM signal.

Referring to FIG. 7 again, in an optional implementation, the switch controller 20 further includes a protection resistor 118. The output terminal of the signal follower circuit 22 is connected to an input terminal of the comparison circuit 23 by the protection resistor 118.

In the foregoing implementations, the protection resistor 118 can ensure the stability of the transmitted second PWM signal, to prevent the second PWM signal from becoming unstable under the impact of the load.

Figure 11:
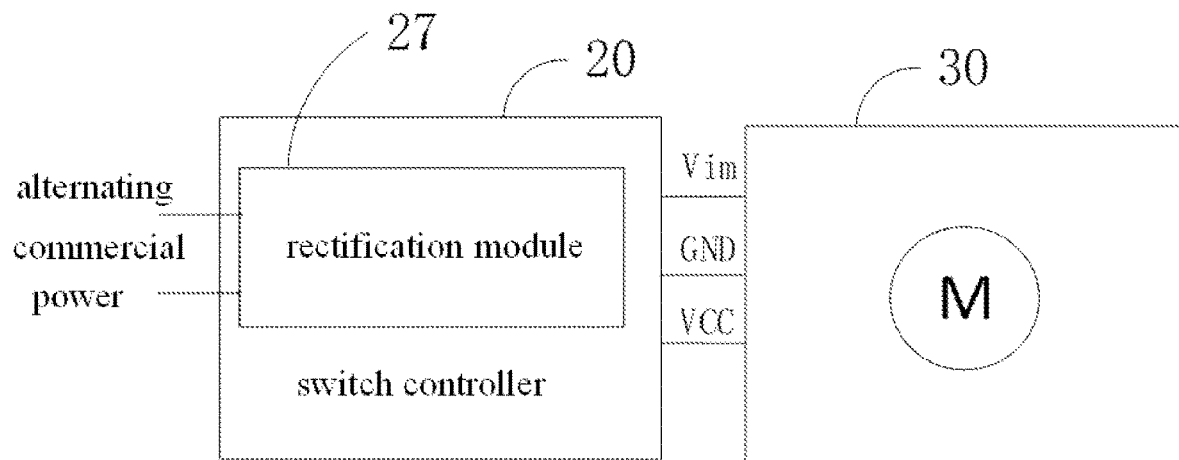
FIG. 11 is a schematic diagram of an electronic device according to an embodiment of the present application.

Referring to FIG. 11, in an optional implementation, the switch controller 20 further includes a rectification module 27 connected to the input terminal of the signal modulation circuit 21.

The rectification module 27 may include a rectifier bridge, configured to rectify alternating current power into direct current power, to facilitate the supply of direct current power to the direct current motor. A wiring terminal Vim shown in FIG. 6 is configured to supply power for the rotation of the motor. A wiring terminal GND is used for grounding. A wiring terminal VCC supplies power to a control module of the device body 30. An operating manner of the control module in the device body 30 is known to a person skilled in the art.

Figure 10:
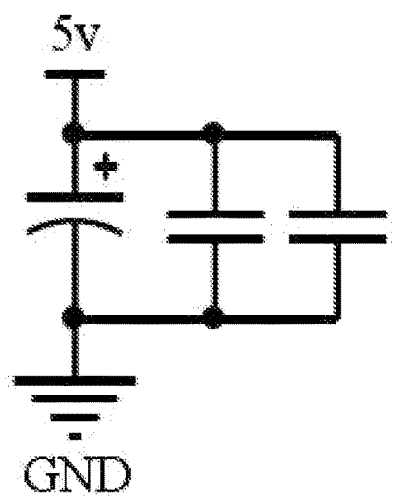
FIG. 10 is a schematic diagram of a voltage stabilizing circuit according to an embodiment of the present application.

Referring to FIG. 10, in an optional implementation, the switch controller 20 may further include a voltage stabilizing circuit 25 configured to perform voltage stabilization on the reference signal received by the comparison circuit 23.

The voltage stabilizing circuit 25 may include a polarized capacitor and two non-polarized capacitors. The polarized capacitor and the two non-polarized capacitors are connected in parallel. One terminal of the parallel connection is connected to a fifth power supply. The other terminal of the parallel connection is grounded. The fifth power supply may be a 5-V power supply. The voltage stabilizing circuit 25 is used for supplying a stable 5-V power supply to the comparator 121, to improve the stability of the reference signal.

Based on the foregoing design, the signal modulation circuit 21 may perform smoothing on the first PWM signal. In this way, a response can be made in time to a pulse width that changes suddenly. The modulated second PWM signal is an analog voltage signal. After modulation by the signal follower circuit 22, the loading capability and anti-interference capability of the second PWM signal can be improved. Safe and reliable protection can be provided for surges and static electricity of a PWM signal based on the magnetic ball 101, the protection subcircuit 26, and the protection resistor 118. In addition, the device body 30 may turn on the control power supply when there is a PWM signal (the first PWM signal) and turn off the control power supply when there is no PWM signal, thereby minimizing the power consumption.

Referring to FIG. 11 again, the embodiments of the present application further provide an electronic device 10. The electronic device 10 includes a device body 30 and the foregoing switch controller 20. A control terminal of the device body 30 is connected to an output terminal of the switch controller 20. The device body 30 is started in response to receiving a control signal outputted by the output terminal of the switch controller 20.

In this embodiment, the device body 30 may be determined according to an actual case. For example, the device body 30 includes a direct current motor. For example, the device body 30 may be a brushless direct current motor in an air purifier.

It needs to be noted that in this embodiment, the parameters of various resistors, capacitors, magnetic balls, and diodes may be selected according to an actual case and are known to a person skilled in the art. Such parameters are not specifically limited herein.

In summary, the present application provides a switch controller and an electronic device. The switch controller may include a signal modulation circuit, a signal follower circuit, a comparison circuit, and a switch control circuit. An input terminal of the signal modulation circuit is configured to receive a first PWM signal. An output terminal of the signal modulation circuit is connected to an input terminal of the signal follower circuit, and is configured to output a second PWM signal representing an analog signal obtained by modulating the first PWM signal by the signal modulation circuit. An output terminal of the signal follower circuit is connected to a first input terminal of the comparison circuit. The signal follower circuit is configured to increase a current load power of the second PWM signal to a preset load power. An output terminal of the comparison circuit is connected to an input terminal of the switch control circuit, and is configured to receive a reference signal at a second input terminal of the comparison circuit, and a control signal is outputted in a case that the first input terminal receives the second PWM signal. An output terminal of the switch control circuit is connected to a control terminal of a device body of an electronic device. The switch control circuit controls, in response to receiving the control signal, a switch device in the switch control circuit to be in an on state. In this solution, the switch controller may perform digital-to-analog conversion by using the signal modulation circuit, to modulate a first PWM signal being a digital signal into a second PWM signal being an analog signal, and then the signal follower circuit performs load amplification on the modulated second PWM signal, to avoid that the second PWM signal has a small load and cannot be used to control the on or off of the switch control circuit, thereby mitigating the problem that it is inconvenient to use a PWM signal to control an electronic device to start or stop.

Described above are merely some embodiments of the present application, and are not intended to limit the scope of protection of the present application. A person skilled in the art may make various changes and variations to the present application. Within the spirit and principle of the present application, any modifications, equivalent substitutions, improvements, and the like shall fall within the scope of protection of the present application.

What is claimed is:

1. A gear control circuit for an alternating current motor, the gear control circuit comprising:
    a plurality of controllable switches, the controllable switches being connected to a live wire of an alternating current power supply and being connected to a plurality of gears of an alternating current motor in a one-to-one correspondence;
    a detection unit, connected to the controllable switches, and configured to detect switching statuses corresponding to the controllable switches;
    a gear input unit, configured to receive a target gear m inputted from outside; and
    a control unit, connected to the gear input unit and configured to obtain the target gear m, wherein the control unit is further connected to the controllable switches and the detection unit and configured to obtain a current gear n of the alternating current motor according to the switching statuses of the controllable switches; if m is greater than n, the control unit controls controllable switches corresponding to all gears between n and m to be sequentially turned on in an ascending order of the gears and turns off a controllable switch corresponding to a gear i−1 after a controllable switch corresponding to a gear i is turned on; and if m is less than n, the control unit controls controllable switches corresponding to all gears between m and n to be sequentially turned on in a descending order of the gears and turns off a controllable switch corresponding to a gear i+1 after a controllable switch corresponding to a gear i is turned on.

2. The gear control circuit according to claim 1, wherein the detection unit comprises a plurality of status detection circuits, and two input terminals of each status detection circuit are respectively connected to an output terminal of a controllable switch and a neutral wire of the alternating current power supply, to obtain a switching status corresponding to the connected controllable switch; and
the control unit is connected to an output terminal of each status detection circuit and configured to receive the switching statuses of the controllable switches, and in response to determining, according to the switching statuses of the controllable switches, that only one controllable switch is in a closed state, a gear corresponding to the controllable switch in a closed state is determined as the current gear of the alternating current motor.

3. The gear control circuit according to claim 2, wherein the control unit is further configured to determine, in response to determining that no controllable switch is in a closed state, that the alternating current motor is not started.

4. The gear control circuit according to claim 2, wherein each status detection circuit comprises a resistor R1, a resistor R2, a diode Q1, an optoisolator D1, a resistor R3, a resistor R4, a resistor R5, and a capacitor C1, one terminal of the resistor R1 is connected to an output terminal of a controllable switch of a corresponding gear, the other terminal of the resistor R1 is connected to a first terminal of the resistor R2, a second terminal of the resistor R2 is connected to a positive electrode of a transmit terminal of the optoisolator D1, a first terminal of the resistor R3 is connected to a neutral wire of a power supply source, a second terminal of the resistor R3 is connected to a negative electrode of the transmit terminal of the optoisolator D1, a positive electrode of the diode Q1 is connected to the first terminal of the resistor R3, a negative electrode of the diode Q1 is connected to the second terminal of the resistor R2, and a collector of a receive terminal of the optoisolator D1 is connected to the control unit by the resistor R4; the collector of the receive terminal of the optoisolator D1 is connected to a high-level signal by the resistor R5; and an emitter of the receive terminal of the optoisolator D1 is grounded and is connected to the control unit by the capacitor C1.

5. The gear control circuit according to claim 4, wherein the controllable switch is a relay, and one terminal of the resistor R1 is connected to a normally open contact of a relay of a corresponding gear.

6. The gear control circuit according to claim 2, wherein the detection unit further comprises a power supply detection circuit, two input terminals of the power supply detection circuit are respectively connected to the live wire and the neutral wire of the alternating current power supply, an output terminal of the power supply detection circuit is connected to the control unit, the power supply detection circuit is configured to acquire a power supply source signal, and the power supply source signal comprises a power supply voltage signal and a power supply frequency signal; and
the control unit is further configured to determine the presence or absence of a power supply source according to the power supply voltage signal, and determine, according to the power supply frequency signal, a delay in controlling a controllable switch to be closed.

7. The gear control circuit according to claim 6, wherein the power supply detection circuit comprises a resistor R6, a resistor R7, a diode Q2, an optoisolator D2, a resistor R8, a resistor R9, a resistor R10, and a capacitor C2, one terminal of the resistor R6 is connected to the live wire of the alternating current power supply, the other terminal of the resistor R6 is connected to a first terminal of the resistor R7, a second terminal of the resistor R7 is connected to a positive electrode of a transmit terminal of the optoisolator D2, a first terminal of the resistor R8 is connected to the neutral wire of the alternating current power supply, a second terminal of the resistor R8 is connected to a negative electrode of the transmit terminal of the optoisolator D2, a positive electrode of the diode Q2 is connected to the first terminal of the resistor R8, a negative electrode of the diode Q2 is connected to the second terminal of the resistor R7, and a collector of a receive terminal of the optoisolator D2 is connected to the control unit by the resistor R9; the collector of the receive terminal of the optoisolator D2 is connected to a high-level signal by the resistor R10; and an emitter of the receive terminal of the optoisolator D2 is grounded and is connected to the control unit by the capacitor C2.

8. The gear control circuit according to claim 1, wherein the gear control circuit further comprises a rectification unit, and the control unit is connected to the alternating current power supply by the rectification unit.

9. The gear control circuit according to claim 8, wherein the gear control circuit further comprises a filter anti-interference unit, a ground wire of the alternating current power supply is connected to the alternating current motor by the filter anti-interference unit, the neutral wire of the alternating current power supply is connected to the alternating current motor and the rectification unit by the filter anti-interference unit, and the live wire of the alternating current power supply is connected to the rectification unit and an input terminal of the controllable switch by the filter anti-interference unit.

10. A gear control system for an alternating current motor, wherein the system comprises an alternating current power supply, an alternating current motor, and the gear control circuit according to claim 1, the alternating current motor comprises a plurality of gears, the gears correspond to different motor rotation speeds, and controllable switches in the gear control circuit are connected to a live wire of the alternating current power supply and are connected to the plurality of gears of the alternating current motor in a one-to-one correspondence.

11. A switch controller, wherein the switch controller comprises a signal modulation circuit, a signal follower circuit, a comparison circuit, and a switch control circuit;
an input terminal of the signal modulation circuit is configured to receive a first pulse width modulation (PWM) signal, and an output terminal of the signal modulation circuit is connected to an input terminal of the signal follower circuit, and is configured to output a second PWM signal representing an analog signal obtained by modulating the first PWM signal by the signal modulation circuit;
an output terminal of the signal follower circuit is connected to a first input terminal of the comparison circuit, and the signal follower circuit is configured to increase a current load power of the second PWM signal to a preset load power;
an output terminal of the comparison circuit is connected to an input terminal of the switch control circuit, and is configured to receive a reference signal at a second input terminal of the comparison circuit, and a control signal is outputted in a case that the first input terminal receives the second PWM signal; and an output terminal of the switch control circuit is connected to a control terminal of a device body of an electronic device, and the switch control circuit controls, in response to receiving the control signal, a switch device in the switch control circuit to be in an on state, wherein the signal follower circuit comprises a follower and a protection subcircuit, an input terminal of the follower is used as the input terminal of the signal follower circuit, an output terminal of the follower is connected to an input terminal of the protection subcircuit, an output terminal of the protection subcircuit is used as the output terminal of the signal follower circuit, and the protection subcircuit is configured to isolate and buffer the second PWM signal.

12. The switch controller according to claim 11, wherein the switch control circuit comprises a first capacitor, a second capacitor, a third capacitor, a fourth capacitor, a first diode, a second diode, a first resistor, a second resistor, a third resistor, triode, and a MOS transistor representing the switch device;

a first terminal of the first capacitor and a first terminal of the first resistor are connected to the output terminal of the comparison circuit, a second terminal of the first capacitor is grounded, a second terminal of the first resistor is connected to a base of the triode, an emitter of the triode is grounded, a collector of the triode is connected to a first terminal of the third resistor, a second terminal of the third resistor is connected to a first terminal of the second resistor and a first terminal of the MOS transistor, and a second terminal of the second resistor and a second terminal of the MOS transistor are both connected to an input terminal of a control power supply;

a first terminal of the first diode, a first terminal of the second capacitor, and a first terminal of the third capacitor are all connected to the input terminal of the control power supply, and a second terminal of the first diode, a second terminal of the second capacitor, and a second terminal of the third capacitor are all grounded;

a third terminal of the MOS transistor is used as the output terminal of the switch control circuit, the first terminal of the third resistor and a first terminal of the second diode are both connected to the third terminal of the MOS transistor, and the second terminal of the third resistor and a second terminal of the second diode are both grounded;

in a case that the triode receives the control signal through the first resistor, the second terminal of the MOS transistor and the third terminal of the MOS transistor are connected; and in a case that the triode does not receive the control signal through the first resistor, the second terminal of the MOS transistor and the third terminal of the MOS transistor are disconnected.

13. The switch controller according to claim 11, wherein the comparison circuit comprises a comparator, and a first input terminal of the comparator is configured to use a designated resistor to receive the second PWM signal outputted by the signal follower circuit;

a second input terminal of the comparator is configured to receive the reference signal; and an output terminal of the comparator is used as the output terminal of the comparison circuit.

14. The switch controller according to claim 11, wherein the switch controller further comprises a magnetic ball, and the signal modulation circuit is configured to receive the first PWM signal through the magnetic ball.

15. The switch controller according to claim 11, wherein the switch controller further comprises a protection resistor, the output terminal of the signal follower circuit is connected to an input terminal of the comparison circuit by the protection resistor.

16. The switch controller according to claim 11, wherein the switch controller further comprises a rectification module connected to the input terminal of the signal modulation circuit.

17. The switch controller according to claim 11, wherein the switch controller further comprises a voltage stabilizing circuit configured to perform voltage stabilization on the reference signal received by the comparison circuit.

18. An electronic device, the electronic device comprising a device body and the switch controller according to claim 11, a control terminal of the device body being connected to an output terminal of the switch controller, wherein the device body is started in response to receiving a control signal outputted by the output terminal of the switch controller.

19. The electronic device according to claim 18, wherein the device body comprises a direct current motor.

* * * * *